(12) United States Patent
Fang et al.

(10) Patent No.: US 10,636,745 B2
(45) Date of Patent: Apr. 28, 2020

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Jen-Kuang Fang, Kaohsiung (TW); Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 45 days.

(21) Appl. No.: 15/717,705

(22) Filed: Sep. 27, 2017

(65) Prior Publication Data
US 2019/0096823 A1    Mar. 28, 2019

(51) Int. Cl.
*H01L 23/00* (2006.01)
*H01L 23/538* (2006.01)
(Continued)

(52) U.S. Cl.
CPC ........ *H01L 23/562* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3114* (2013.01); *H01L 23/5383* (2013.01); *H01L 23/5386* (2013.01); *H01L 23/5389* (2013.01); *H01L 24/13* (2013.01); *H01L 24/16* (2013.01); *H01L 24/19* (2013.01); *H01L 24/20* (2013.01); *H01L 24/02* (2013.01); *H01L 24/03* (2013.01); *H01L 24/05* (2013.01); *H01L 24/11* (2013.01); *H01L 2221/68345* (2013.01); *H01L 2221/68359* (2013.01); *H01L 2224/02331* (2013.01); *H01L 2224/02379* (2013.01); *H01L 2224/0345* (2013.01); *H01L 2224/0346* (2013.01); *H01L 2224/04105* (2013.01); *H01L 2224/05639* (2013.01); *H01L 2224/05644* (2013.01); *H01L 2224/05647* (2013.01); *H01L 2224/11002* (2013.01); *H01L 2224/1147* (2013.01); *H01L 2224/11849* (2013.01); *H01L 2224/12105* (2013.01); *H01L 2224/13019* (2013.01);
(Continued)

(58) Field of Classification Search
CPC .......................... H01L 23/562; H01L 21/4853
See application file for complete search history.

(56) References Cited

U.S. PATENT DOCUMENTS

2005/0093172 A1    5/2005  Tsukahara et al.
2009/0091030 A1*   4/2009  Ohnishi .................. H01L 24/11
                                                    257/737
(Continued)

FOREIGN PATENT DOCUMENTS

EP           1 204 136 B1    8/2009

*Primary Examiner* — Marc Anthony Armand
(74) *Attorney, Agent, or Firm* — Foley & Lardner LLP

(57) ABSTRACT

A semiconductor package device comprises an electronic component, a conductive bump and a first conductive layer. The electronic component has a top surface. The conductive bump is disposed on the top surface of the electronic component. The conductive bump includes a main body and a protruding portion. The first conductive layer covers a portion of the protruding portion. The first conductive layer has a first upper surface and a second upper surface. The first upper surface and the second upper surface are not coplanar.

20 Claims, 20 Drawing Sheets

(51) Int. Cl.
*H01L 23/31* (2006.01)
*H01L 21/48* (2006.01)
*H01L 21/56* (2006.01)
*H01L 21/683* (2006.01)

(52) U.S. Cl.
CPC ............ *H01L 2224/13139* (2013.01); *H01L 2224/13144* (2013.01); *H01L 2224/13147* (2013.01); *H01L 2224/16237* (2013.01); *H01L 2224/18* (2013.01); *H01L 2224/214* (2013.01); *H01L 2224/215* (2013.01); *H01L 2224/96* (2013.01); *H01L 2924/3512* (2013.01)

(56) References Cited

U.S. PATENT DOCUMENTS

2014/0077369 A1* 3/2014 Liang ............... H01L 23/49827
                                                      257/738
2016/0276256 A1* 9/2016 Chiang ............ H01L 23/49827

* cited by examiner

SEMICONDUCTOR PACKAGE DEVICE AND METHOD OF MANUFACTURING THE SAME

BACKGROUND

1. Technical Field

The present disclosure relates generally to a semiconductor package device and a method of manufacturing the same, and to a semiconductor package device including a conductive bump structure and a method of manufacturing the same.

2. Description of the Related Art

A conductive bump can be used as an electrical contact for electrical connection. In some comparative processes for forming a conductive bump, a grinding process is carried out to expose a portion of the conductive bump. However, during the grinding process, contaminants or residues may be deposited on the exposed portion of the conductive bump, which can adversely affect the electrical connection of the conductive bump. In addition, mitigating against delamination of the conductive bump and accounting for residual stress can be challenges in designing a conductive bump.

SUMMARY

In one or more embodiments, a semiconductor package device includes an electronic component, a conductive bump and a first conductive layer. The electronic component has a top surface. The conductive bump is disposed on the top surface of the electronic component. The conductive bump includes a main body and a protruding portion. The first conductive layer covers a portion of the protruding portion. The first conductive layer has a first upper surface and a second upper surface. The first upper surface and the second upper surface are not coplanar.

In one or more embodiments, a semiconductor package device includes an electronic component, a conductive bump and a first conductive layer. The electronic component has a top surface. The conductive bump is disposed on the top surface of the electronic component. The conductive bump includes a main body and a protruding portion. The first conductive layer covers a portion of the protruding portion. The first conductive layer includes a first portion conformal to a portion of the protruding portion of the conductive bump.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
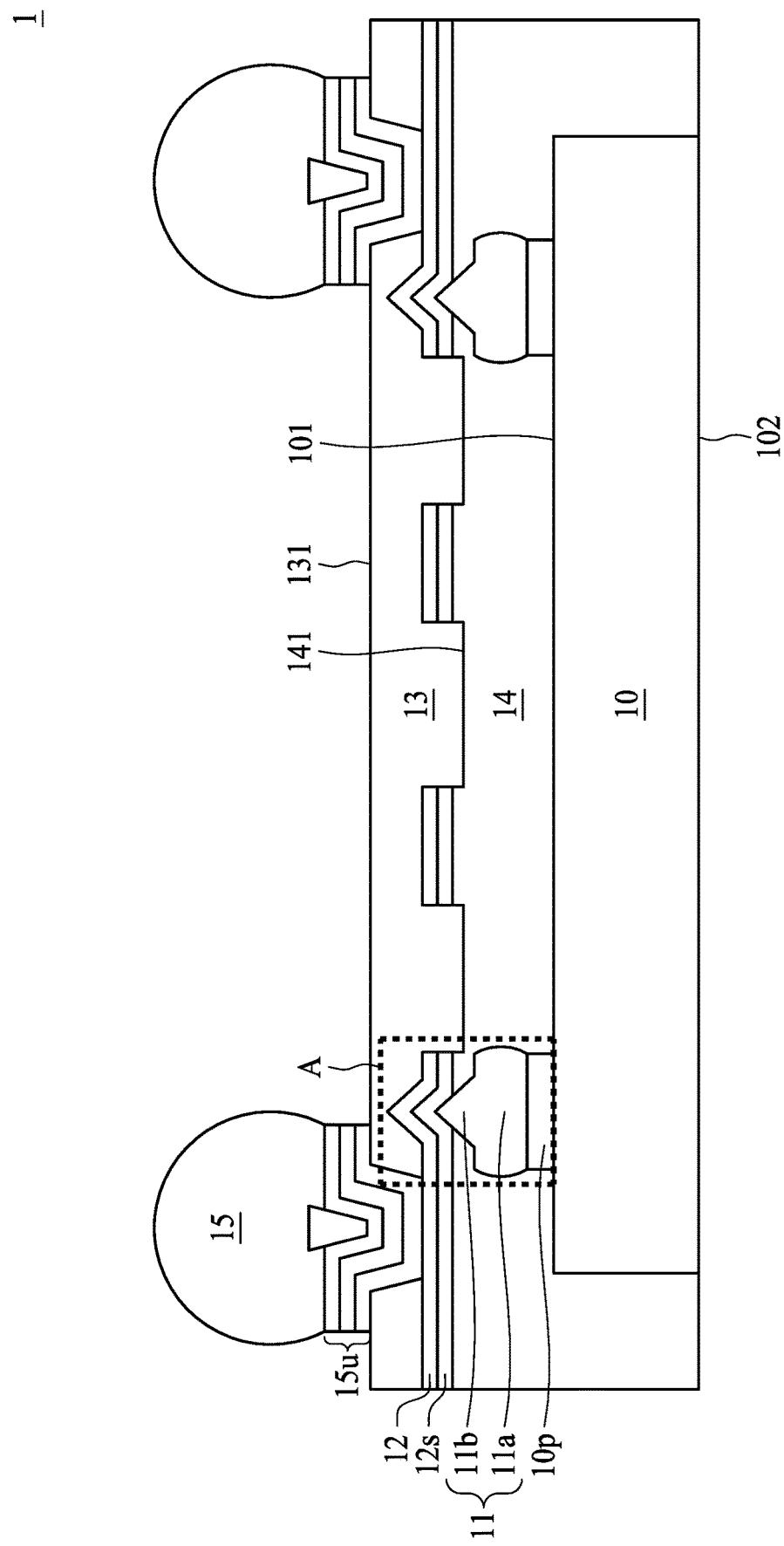
FIG. 1A illustrates a cross-sectional view of a semiconductor package device in accordance with some embodiments of the present disclosure.

FIG. 1A illustrates a cross-sectional view of a semiconductor package device 1 in accordance with some embodiments of the present disclosure. The semiconductor package device 1 includes an electronic component 10, a conductive bump 11, a conductive layer 12, a dielectric layer 13, a package body 14 and an electrical contact 15.

The electronic component 10 may include a chip or a die including a semiconductor substrate, one or more integrated circuit devices and one or more overlying interconnection structures therein. The one or more integrated circuit devices may include active devices such as transistors and/or passive devices such resistors, capacitors, inductors, or a combination of two or more thereof. The electronic component 10 has an active surface 101 and a back surface 102 opposite to the active surface 101.

Figure 1B:
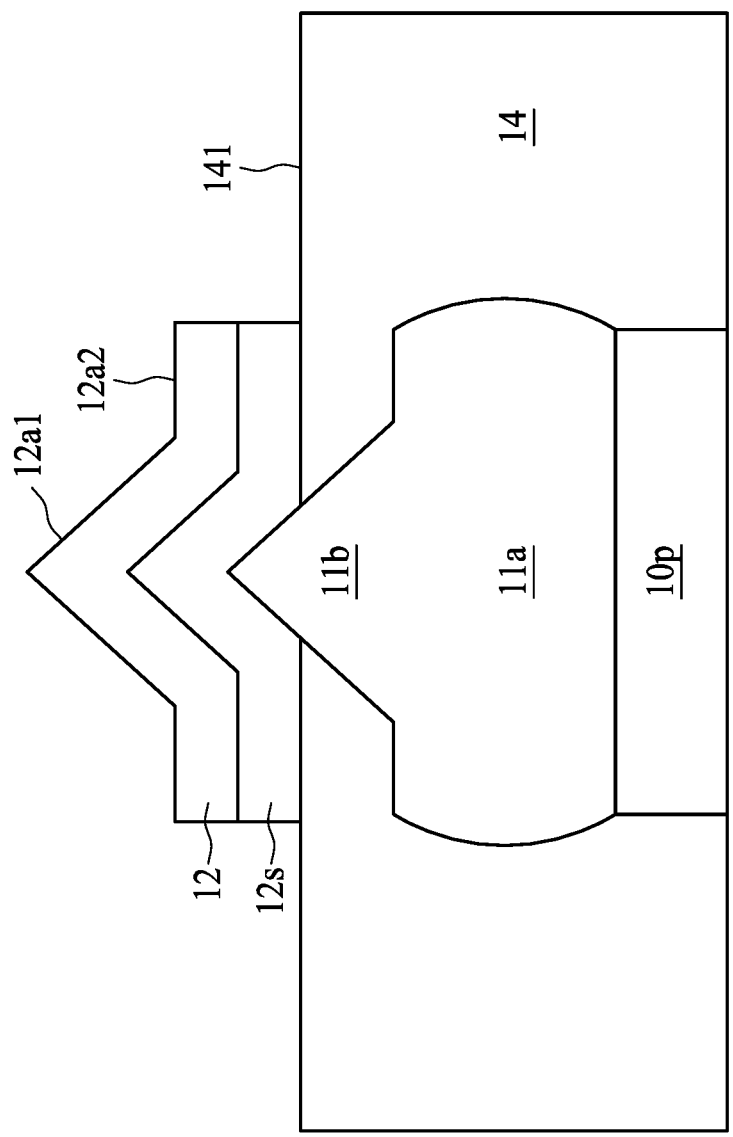
FIG. 1B illustrates an enlarged view of a portion of the semiconductor package device of FIG. 1A in accordance with some embodiments of the present disclosure.

The conductive bump 11 (which can be, for example, a stub bump) is disposed on the active surface 101 of the electronic component 10 and electrically connected to a conductive pad (e.g., a micro pad) 10p on the electronic component 10. As shown in FIG. 1B, which shows an enlarged view of portions of the semiconductor package device 1 indicated by a dotted-line square A in FIG. 1A, the conductive bump 11 includes a main body 11a and a protruding portion 11b disposed on and/or protruding from the main body 11a. In some embodiments, the conductive bump 11 may be or may include gold (Au), silver (Ag), copper (Cu), another metal, a solder alloy, or a combination of two or more thereof.

The package body 14 covers the active surface 101 and lateral surfaces of the electronic component 10 and exposes the back surface 102 of the electronic components 10. The package body 14 also covers the main body 11a of the conductive bump 11 and exposes at least a portion of the protruding portion 11b of the conductive bump 11. In other embodiments, the back surface 102 of the electronic component 10 can be covered by the package body 14 depending on design specifications. In some embodiments, the package body 14 includes, for example, one or more organic materials (e.g., a molding compound, bismaleimide triazine (BT), a polyimide (PI), a polybenzoxazole (PBO), a solder resist, an Ajinomoto build-up film (ABF), a polypropylene (PP), an epoxy-based material, or a combination of two or more thereof), inorganic materials (e.g., silicon, a glass, a ceramic, a quartz, or a combination of two or more thereof), liquid-film material(s) or dry-film material(s), or a combination of two or more thereof.

A seed layer 12s is disposed on the package body 14 and on the protruding portion 11b of the conductive bump 11 that is exposed from the package body 14. The conductive layer 12 is disposed on the seed layer 12s. In some embodiments, the conductive layer 12 includes Cu, Ag, Au, platinum (Pt), aluminum (Al), another metal, a solder alloy, or a combination of two or more thereof. As shown in FIG. 1B, the seed layer 12s covers the exposed portion of the protruding portion 11b of the conductive bump 11. In some embodiments, the seed layer 12s is substantially conformal to the exposed portion of the protruding portion 11b of the conductive bump 11. The conductive layer 12 covers the seed layer 12s and is substantially conformal to the seed layer 12s. For example, the conductive layer 12 has a first upper surface 12a1 and a second upper surface 12a2. The first surface 12a1 and the second surface 12a2 are not coplanar. For example, the second upper surface 12a2 is substantially parallel to a top surface of the package body 14, and the first upper surface 12a1 and the second upper surface 12a2 define an external angle greater than 90 degrees and less than 180 degrees, such as from about 100 degrees to about 170 degrees, or from about 110 degrees to about 160 degrees. In one or more embodiments, the seed layer 12s may have two upper surfaces that define an external angle greater than 90 degrees and less than 180 degrees, such as from about 100 degrees to about 170 degrees, or from about 110 degrees to about 160 degrees.

As shown in FIG. 1A, the dielectric layer 13 (or an insulation layer) is disposed on a top surface 141 of the package body 14 to cover the conductive layer 12. In one or more embodiments, the top surface 141 and a top surface of the protruding portion 11b of the conductive bump 11 that is exposed from the package body 14 may define an external angle greater than 90 degrees and less than 180 degrees, such as from about 100 degrees to about 170 degrees, or from about 110 degrees to about 160 degrees. In some embodiments, the dielectric layer 13 may include an organic material, a solder mask, a PI, an ABF, one or more molding compounds, one or more pre-impregnated composite fibers (e.g., a pre-preg material), a borophosphosilicate glass (BPSG), a silicon oxide, a silicon nitride, a silicon oxynitride, an undoped silicate glass (USG), any combination thereof, or the like. Examples of molding compounds may include, but are not limited to, an epoxy resin including fillers dispersed therein. Examples of a pre-preg material may include, but are not limited to, a multi-layer structure formed by stacking or laminating a number of pre-impregnated materials or sheets. In some embodiments, the dielectric layer 13 may include an inorganic material, such as a silicon-oxide ($SiO_x$), a silicon-nitride ($SiN_x$), a tantalum oxide ($TaO_x$) or the like.

The dielectric layer 13 defines a cavity extending from a top surface 131 of the dielectric layer 13 into the dielectric layer 13 to expose a portion of the conductive layer 12. A conductive layer 15u (e.g., an under bump metallurgy layer (UBM layer)) is disposed on the top surface 131 of the dielectric layer 13 and extends into the cavity of the dielectric layer 13, and is electrically connected to the exposed portion of the conductive layer 12.

The electrical contact 15 (e.g. a solder ball) is disposed on the conductive layer 15u and can provide electrical connections between the semiconductor package device 1 and external components (e.g. external circuits or circuit boards). In some embodiments, the electrical contact 15 includes a controlled collapse chip connection (C4) bump, a ball grid array (BGA) or a land grid array (LGA).

Figure 1C:
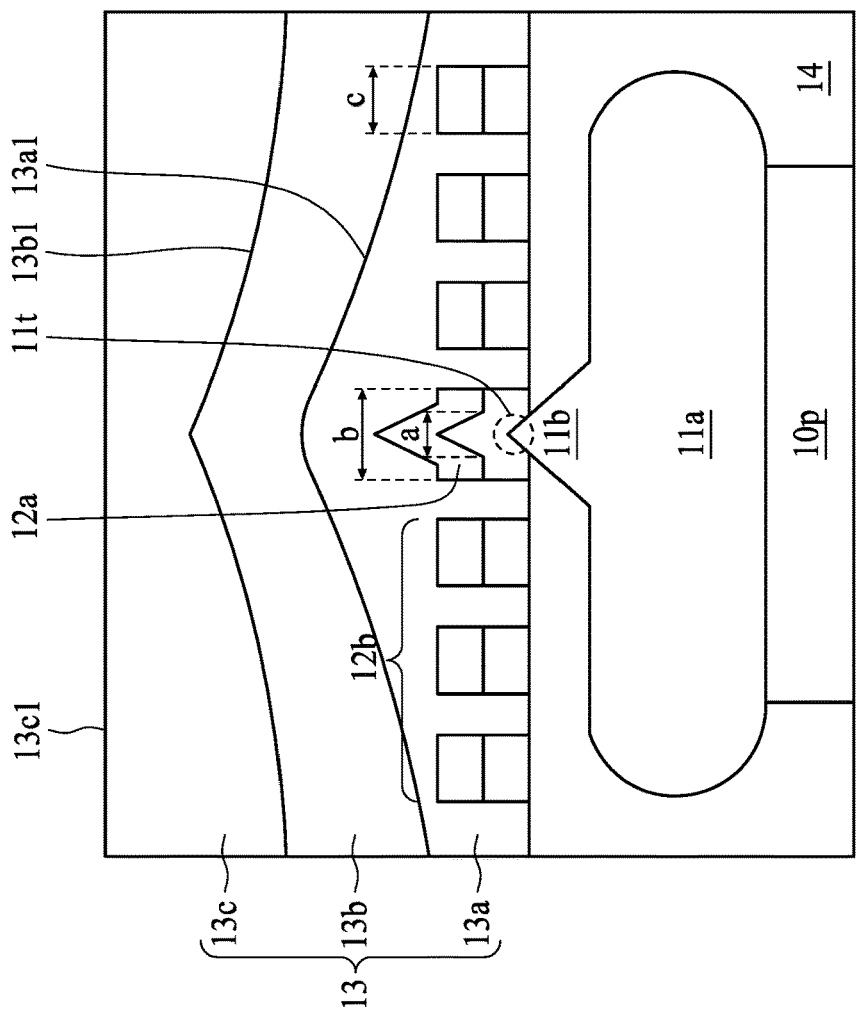
FIG. 1C illustrates an enlarged view of a portion of the semiconductor package device of FIG. 1A in accordance with some embodiments of the present disclosure.
Figure 1D:
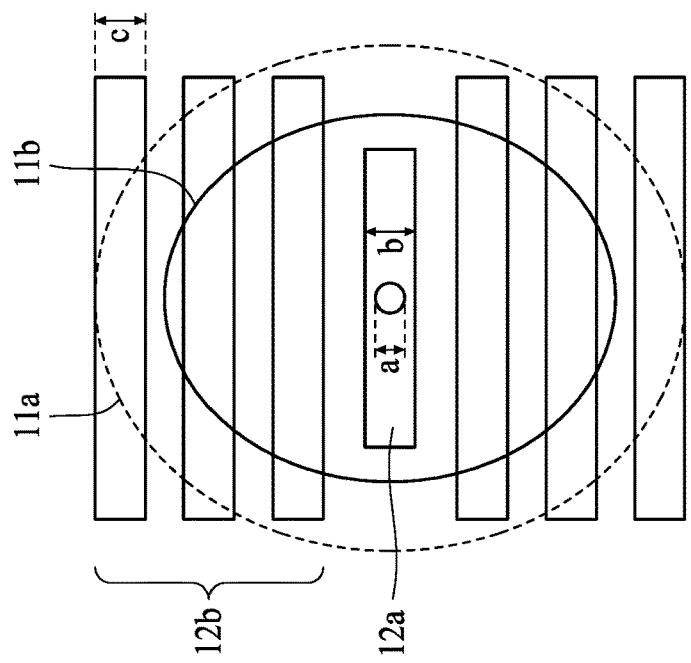
FIG. 1D illustrates a top view of the enlarged view shown in FIG. 1C in accordance with some embodiments of the present disclosure.

FIG. 1C illustrates a cross-sectional view (in a direction perpendicular to the direction of the cross-sectional view of the structure shown in FIG. 1B) of the enlarged portion of the semiconductor package device 1 shown in FIG. 1B, in accordance with some embodiments of the present disclosure. FIG. 1D illustrates a top view of the structure shown in FIG. 1C, in accordance with some embodiments of the present disclosure.

As shown in FIG. 1C and FIG. 1D, the conductive layer 12 includes a trace 12a and a plurality of traces 12b disposed over the conductive bump 11. In some embodiments, at least two traces of the trace 12a and the traces 12b can extend over and can be downwardly projected on the conductive bump 11. For example, there are 7 depicted traces that can be downwardly projected in a direction towards the electronic component 10 on the conductive bump 11 as shown in FIG. 1C and FIG. 1D. The number of traces over the conductive bump 11 or the number of traces that can be downwardly projected in a direction towards the electronic component 10 on to the conductive bump 11 can be set depending on design specifications. The protruding portion 11b of the conductive bump 11 defines a peak 11t covered by the seed layer 12s and/or the conductive layer 12. At least one trace is disposed over the peak 11t of the protruding portion 11b of the conductive bump 11. For example, the trace 12a is disposed over the peak 11t of the protruding portion 11b of the conductive bump 11 while the traces 12b are disposed over the main body 11a of the conductive bump 11. In some embodiments, the trace 12a includes a protruding portion substantially aligned with the protruding portion 11b of the conductive bump 11.

In some embodiments, as shown in FIG. 1C, the dielectric layer 13 may include multiple dielectric layers (or insulation layers), such as a dielectric layer 13a, a dielectric layer 13b and a dielectric layer 13c. The dielectric layer 13a is disposed on the top surface 141 of the package body 14 to cover the trace 12a and the traces 12b. As shown in FIG. 1C, a top surface 13a1 of the dielectric layer 13a is not planar. For example, a first portion of the top surface 13a1 of the dielectric layer 13a disposed over the protruding portion 11b of the conductive bump 11 is higher than a second portion of the top surface 13a1 of the dielectric layer 13a (e.g. the first portion of the top surface 13a1 of the dielectric layer 13a defines a peak). For example, at least a portion of the top surface 13a1 of the dielectric layer 13a is tilted (e.g. at a non-zero angle) relative to a top surface of the electronic component 10, and has a gradient (e.g. a non-zero gradient) relative to the top surface of the electronic component 10.

The dielectric layer 13b is disposed on the top surface 13a1 of the dielectric layer 13a. As shown in FIG. 1C, a top surface 13b1 of the dielectric layer 13b is not planar. For example, a first portion of the top surface 13b1 of the dielectric layer 13b disposed over the protruding portion 11b of the conductive bump 11 is higher than a second portion of the top surface 13b1 of the dielectric layer 13b (e.g. the first portion of the top surface 13b1 of the dielectric layer 13b defines a peak). For example, at least a portion of the top surface 13b1 of the dielectric layer 13b is tilted (e.g. at a non-zero angle) relative to the top surface of the electronic component 10 and has a gradient (e.g. a non-zero gradient) relative to the top surface of the electronic component 10. In some embodiments, the gradient of the top surface 13b1 of the dielectric layer 13b is less than the gradient of the top surface 13a1 of the dielectric layer 13a.

The dielectric layer 13c is disposed on the top surface 13b1 of the dielectric layer 13b. As shown in FIG. 1C, a top surface 13c1 of the dielectric layer 13c is substantially planar. For example, the top surface 13c1 of the dielectric layer 13c is substantially parallel to (and may be coplanar with) the top surface 141 of the package body 14. In some embodiments, the dielectric layer 13 may include a plurality of dielectric layers including the dielectric layer 13a and the dielectric layer 13b in a stacked arrangement depending on design specifications. The top surface 13b1 of the dielectric layer 13b may be farther away from the conductive bump 11, the seed layer 12s, and/or the conductive layer 12 than is the top surface 13a1 of the dielectric layer 13a. The dielectric layer 13a may be adjacent to the conductive bump 11. A gradient of the top surface 13a1 of the dielectric layer 13a relative to the top surface of the electronic component 10 is greater than a gradient of the top surface 13b1 of the second dielectric layer 13b relative to the top surface of the electronic component 10.

In accordance with the embodiments shown in FIG. 1A, FIG. 1B and FIG. 1C, since the conductive bump 11 includes a protruding portion 11b, the protruding portion 11b can be engaged with the seed layer 12s and/or the conductive layer 12, which can increase the bonding strength between the conductive bump 11 and the conductive layer 12. In addition, the protruding portion 11b of the conductive bump 11 may increase a contact area between the conductive bump 11 and the seed layer 12s or the conductive layer 12.

In some embodiments, the conductive bump 11 shown in FIG. 1A, FIG. 1B and FIG. 1C may be replaced by a conductive pillar. However, when a lateral force is applied to the semiconductor package device, the lateral force directly acts on an interface between the conductive pillar and the package body, which can cause a crack at the interface. In accordance with the embodiments shown in FIG. 1A, FIG. 1B and FIG. 1C, since the conductive bump 11 includes a protruding portion 11b, when a lateral force is applied to the semiconductor package device 1, the force can be distributed in a direction substantially parallel to a surface of the protruding portion 11b of the conductive bump 11, which can prevent an interface between the conductive bump 11 and the package body 14 from cracking.

In addition, due to process limitations for at least some conductive pillars, a minimum width of a conductive pillar can be in a range of about 20 micrometers (μm) to about 50 μm according to at least some design specifications. Since a size of a trace should, according to at least some design specifications, be greater than a size of the conductive pillar, the minimum width of the trace is greater than about 20 μm, which can hinder miniaturization of a semiconductor package device that incorporates the conductive pillar. In accordance with the embodiments shown in FIG. 1A, FIG. 1B and FIG. 1C, a width of the peak 11t of the conductive bump 11 is less than about 20 μm (e.g., in a range of about 1.5 μm to about 3 μm), and thus a width of the trace 12a and the traces 12b can be reduced, which can achieve a fine-line design for the conductive layer 12.

Figure 2:
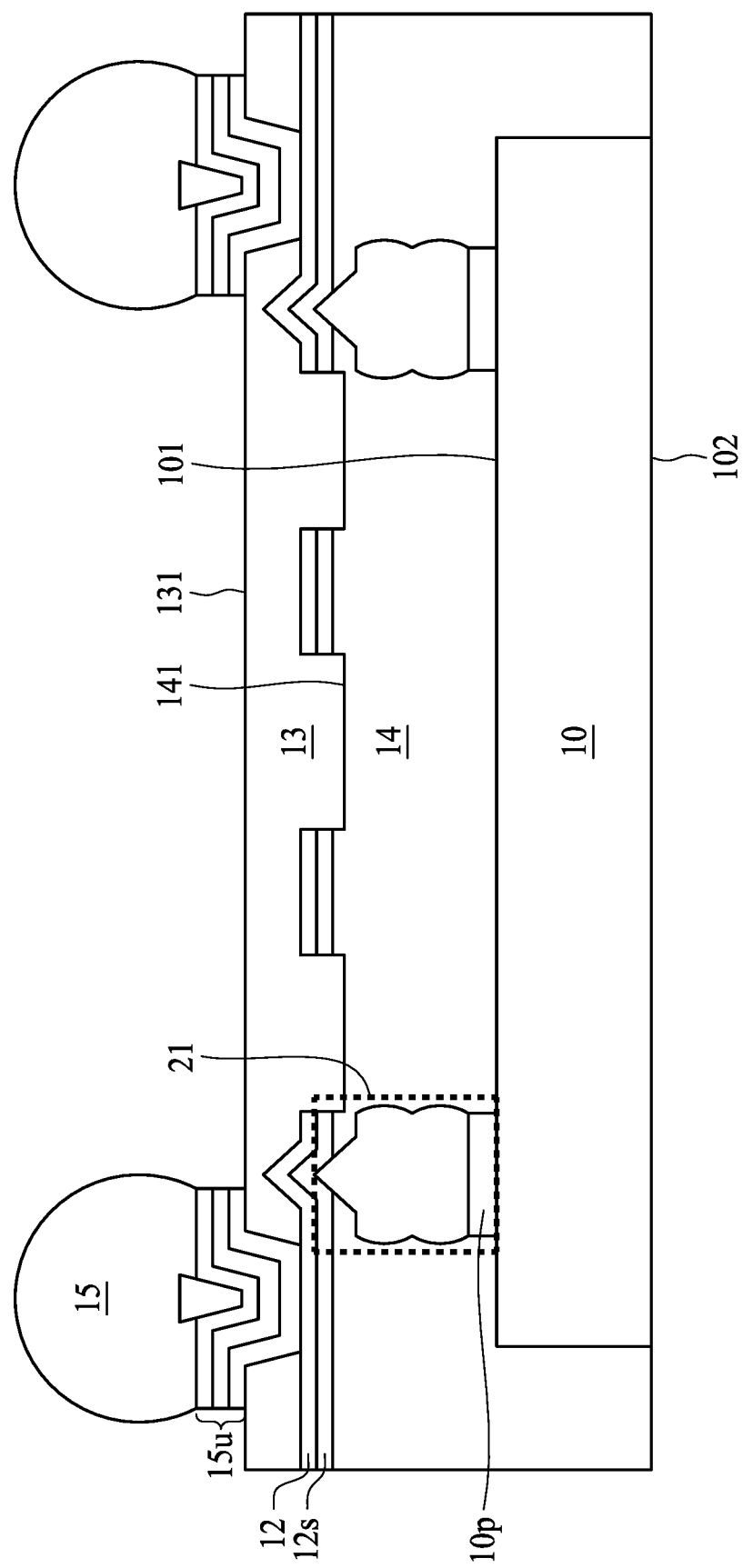
FIG. 2 illustrates a cross-sectional view of a semiconductor package device in accordance with some embodiments of the present disclosure.

FIG. 2 illustrates a cross-sectional view of a semiconductor package device 2 in accordance with some embodiments of the present disclosure. The semiconductor package device 2 is similar to the semiconductor package device 1 in FIG. 1A except that the semiconductor package device 2 includes a multi-layer conductive bump 21 (e.g., including two or more layers) which can, in one or more embodiments, replace the conductive bump 11. The number of the conductive bumps can be selected depending on product specifications.

Figure 3:
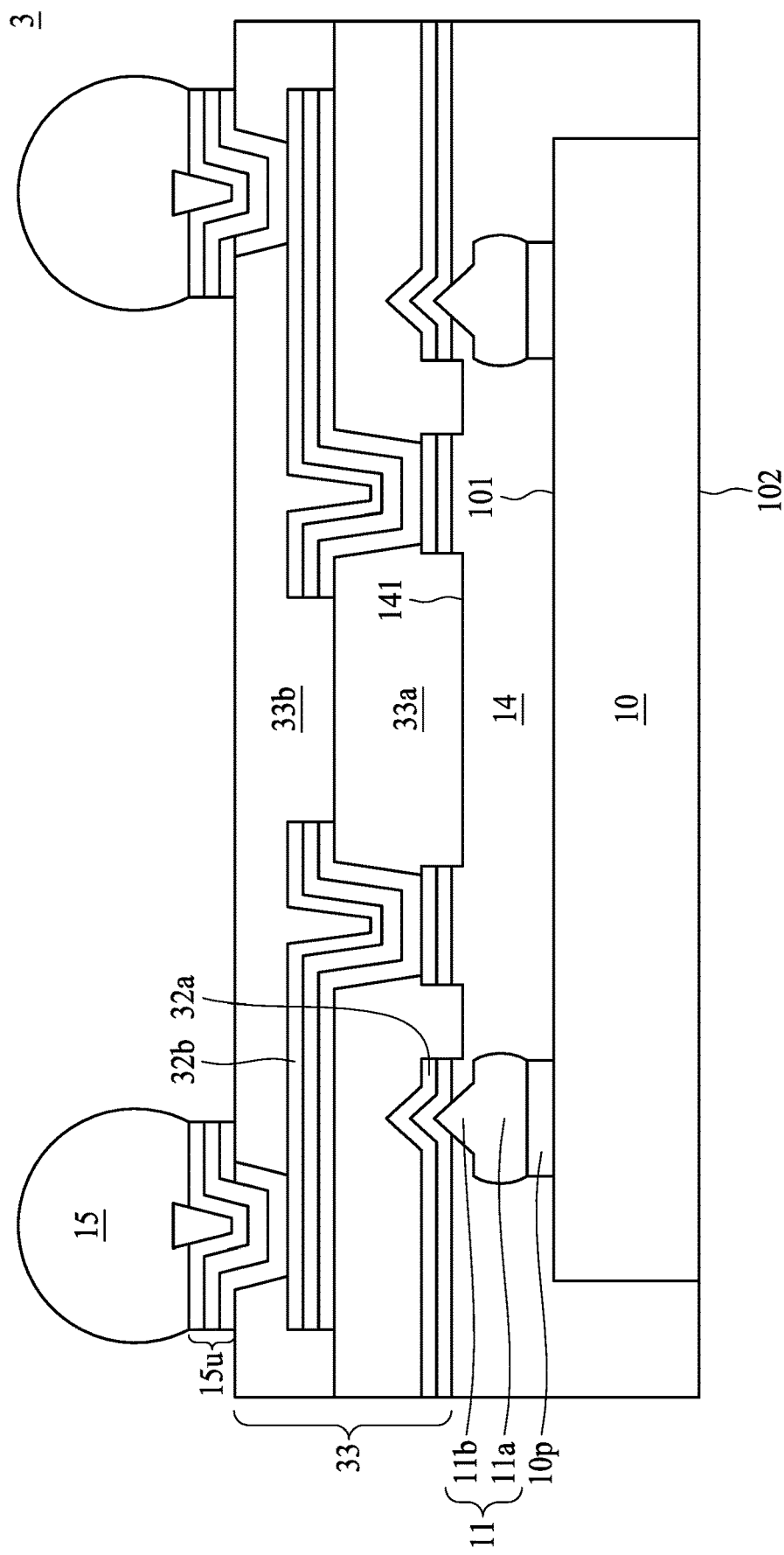
FIG. 3 illustrates a cross-sectional view of a semiconductor package device in accordance with some embodiments of the present disclosure.

FIG. 3 illustrates a cross-sectional view of a semiconductor package device 3 in accordance with some embodiments of the present disclosure. The semiconductor package device 3 is similar to the semiconductor package device 1 in FIG. 1A except that the semiconductor package device 3 includes a multi-layer conductive layer 32 (e.g., including two or more layers). For example, the semiconductor package 3 includes a dielectric layer 33a and a dielectric layer 33b, each dielectric layer including a conductive layer (or redistribution layer) 32a or a conductive layer (or redistribution layer) 32b embedded therein. The number of the conductive layers can be selected depending on product specifications.

Figure 4:
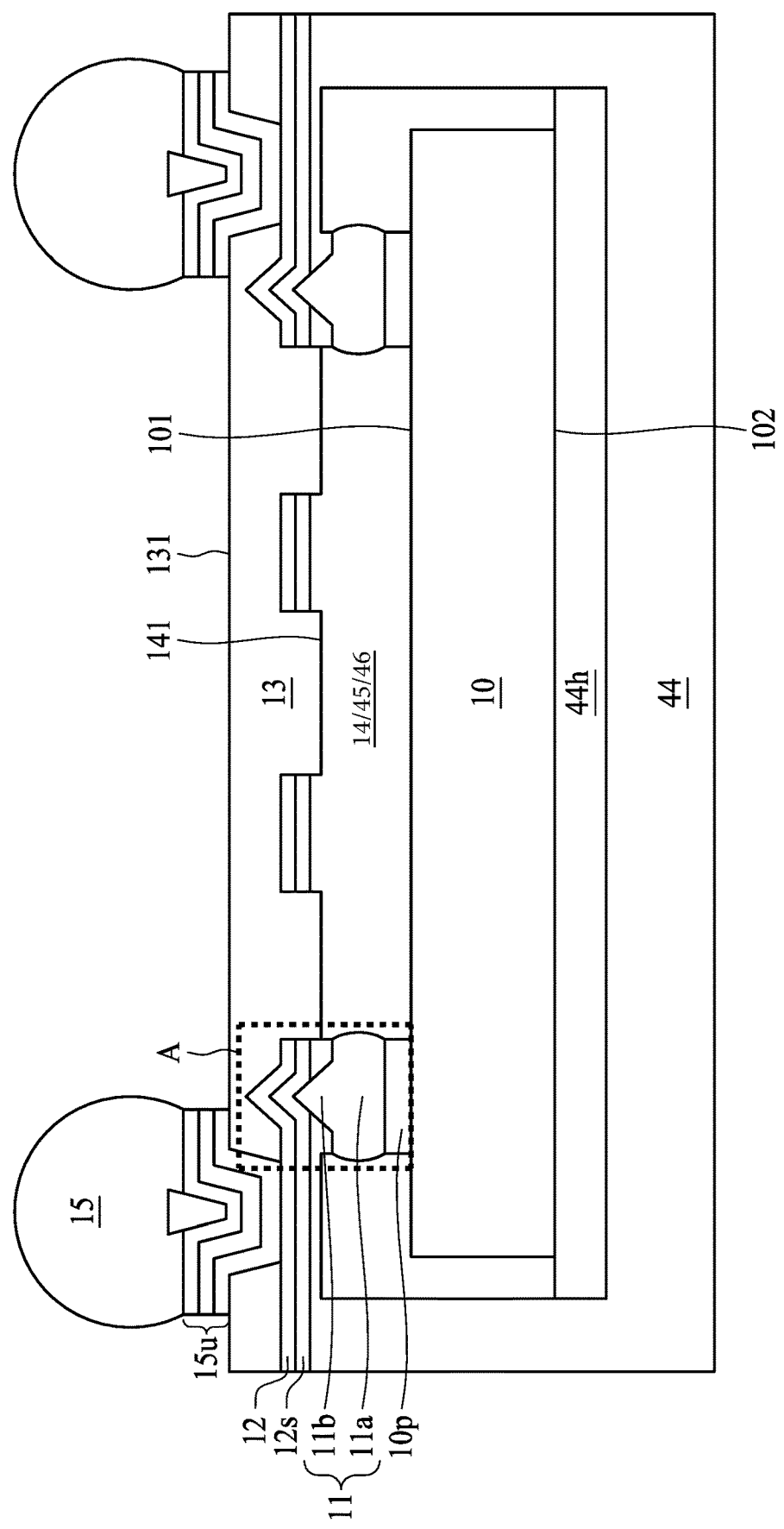
FIG. 4 illustrates a cross-sectional view of a semiconductor package device in accordance with some embodiments of the present disclosure.

FIG. 4 illustrates a cross-sectional view of a semiconductor package device 4 in accordance with some embodiments of the present disclosure. The semiconductor package device 4 is similar to the semiconductor package device 1 in FIG. 1A except that the semiconductor package device 4 further includes a package body 44 covering or encapsulating the package body 14 of the semiconductor package device 1. In some embodiments, the package body 14 covered or encapsulated by the package body 44 may be replaced by a sealing layer 45 or a passivation layer 46.

The package body 44 defines a cavity to accommodate the package body 14 of the semiconductor package device 1. In some embodiments, the package body 14 is attached to a bottom surface of the cavity of the package body 44 through an adhesive 44h (e.g., a glue or a tape). In some embodiments, the package body 44 and the package body 14 are formed of the same material. Alternatively, the package body 44 and the package body 14 are formed of different materials.

Figure 5:
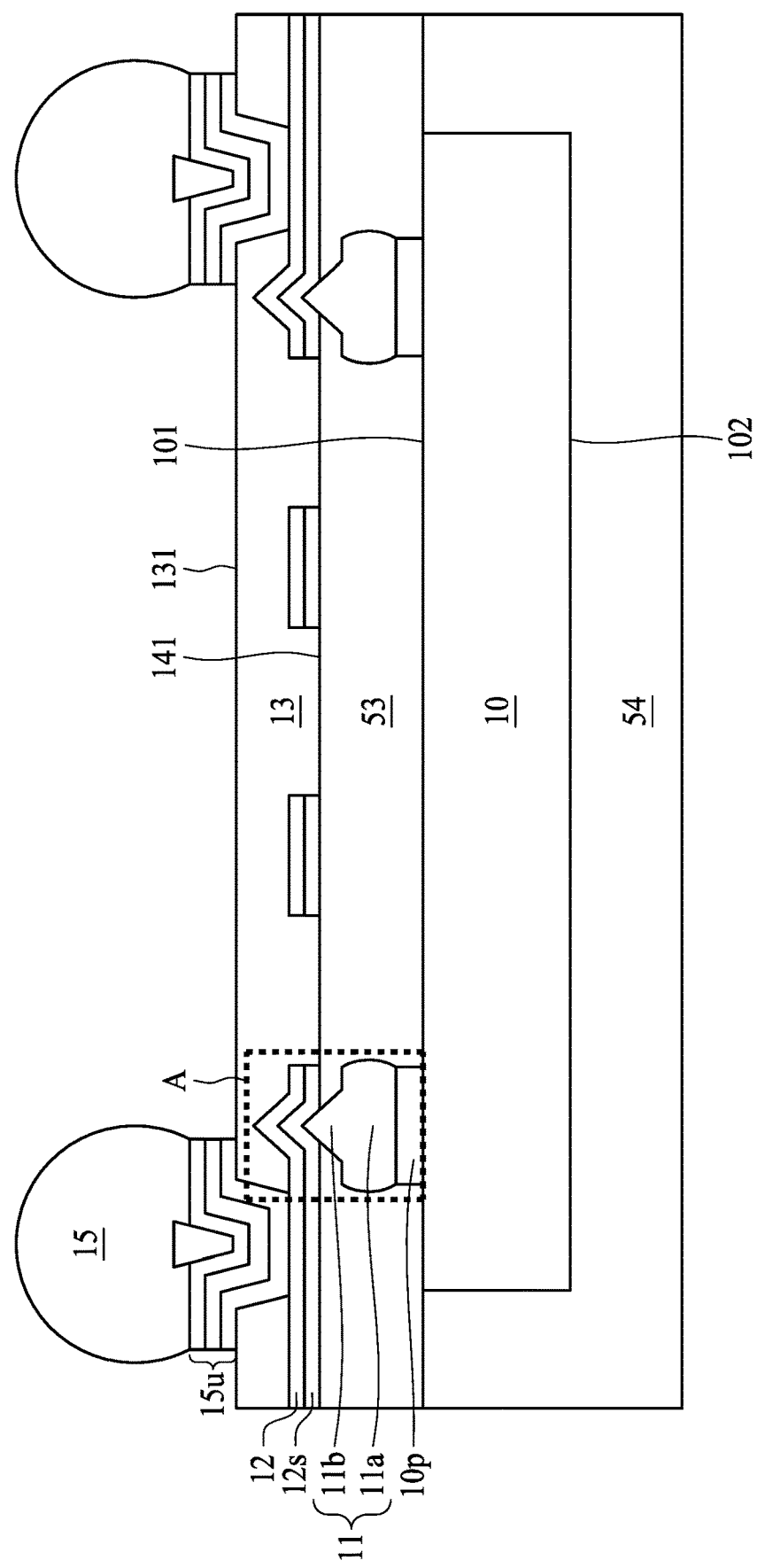
FIG. 5 illustrates a cross-sectional view of a semiconductor package device in accordance with some embodiments of the present disclosure.

FIG. 5 illustrates a cross-sectional view of a semiconductor package device 5 in accordance with some embodiments of the present disclosure. The semiconductor package device 5 is similar to the semiconductor package device 1 in FIG. 1A except that the back surface 102 of the semiconductor package device 5 is covered by a package body 54 and the active surface 101 of the semiconductor package device 5 is covered by a dielectric layer 53, or an insulation layer (e.g. instead of the package body 14). In other embodiments, the back surface 102 of the semiconductor package device 5 can be covered by a metal layer (e.g. including nickel (Ni), titanium (Ti), tungsten (W), Pt or a combination thereof).

Figure 6:
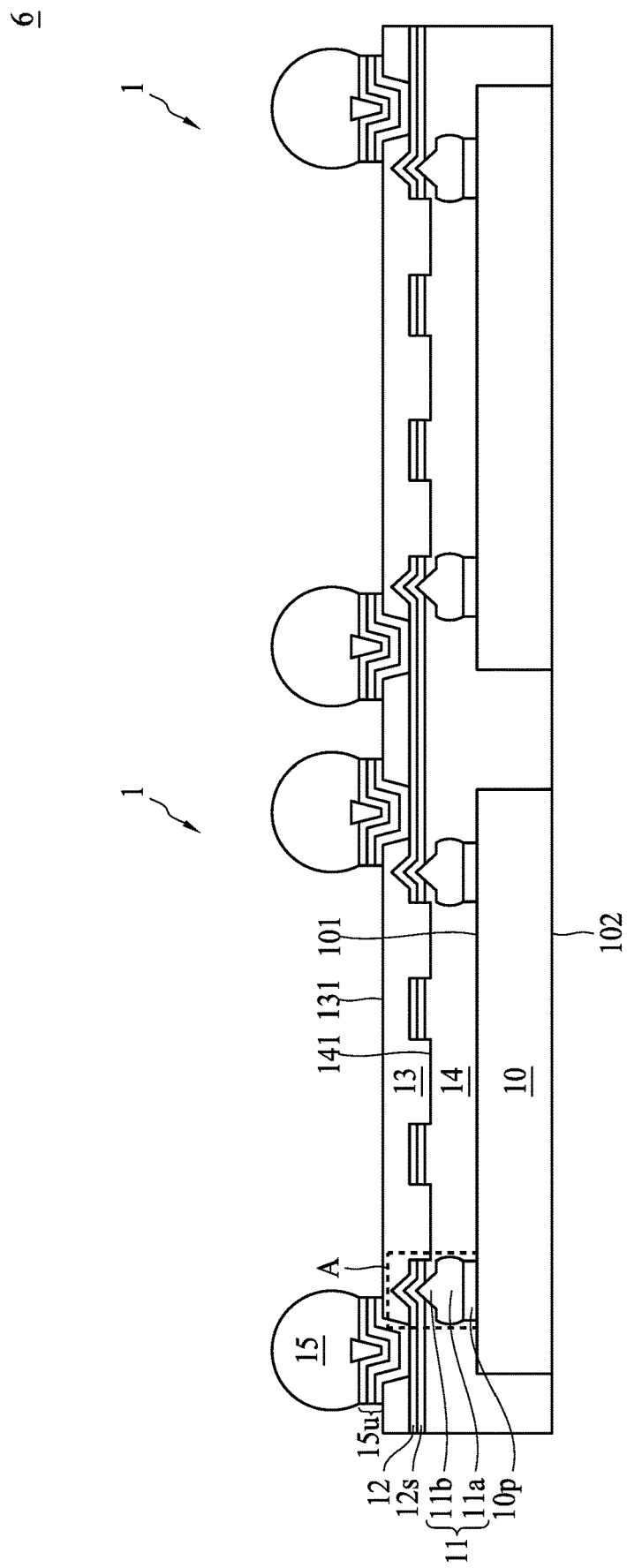
FIG. 6 illustrates a cross-sectional view of a semiconductor package device in accordance with some embodiments of the present disclosure.

FIG. 6 illustrates a cross-sectional view of a semiconductor package device 6 in accordance with some embodiments of the present disclosure. The semiconductor package device 6 includes multiple semiconductor package devices 1 arranged in parallel. In some embodiments, the semiconductor package device 6 may include multiple semiconductor package devices such as those shown in any of FIG. 1A, FIG. 2, FIG. 3, FIG. 4 and FIG. 5 arranged in parallel.

FIG. 7A, FIG. 7B, FIG. 7C, FIG. 7D, FIG. 7E, FIG. 7F, FIG. 7G, FIG. 7H, FIG. 7I, FIG. 7J and FIG. 7K are cross-sectional views of a semiconductor structure at various stages of fabrication, in accordance with some embodiments of the present disclosure. At least some of these figures have been simplified for a better understanding of the aspects of the present disclosure.

Figure 7A:
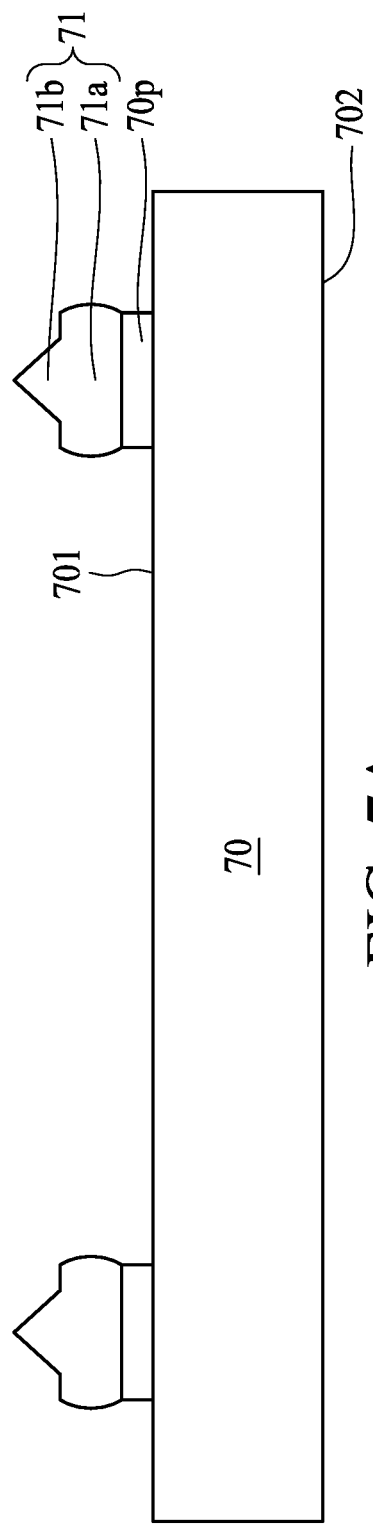
FIG. 7A illustrates one or more stages of a method of manufacturing a semiconductor package device in accordance with some embodiments of the present disclosure.

Referring to FIG. 7A, an electronic component 70 is provided. The electronic component 70 has an active surface 701 and a back surface 702 opposite to the active surface 701. A conductive bump 71 (e.g., a stub bump) is bonded to a conductive pad 70p (e.g., a micro pad) on the active surface 701 of the electronic component 70. The conductive bump 71 includes a main body 71a and a protruding portion 71b disposed on or protruding from the main body 71a. In some embodiments, the conductive bump 71 may be or may include Au, Ag, Cu, another metal, a solder alloy, or a combination of two or more thereof.

Figure 7B:
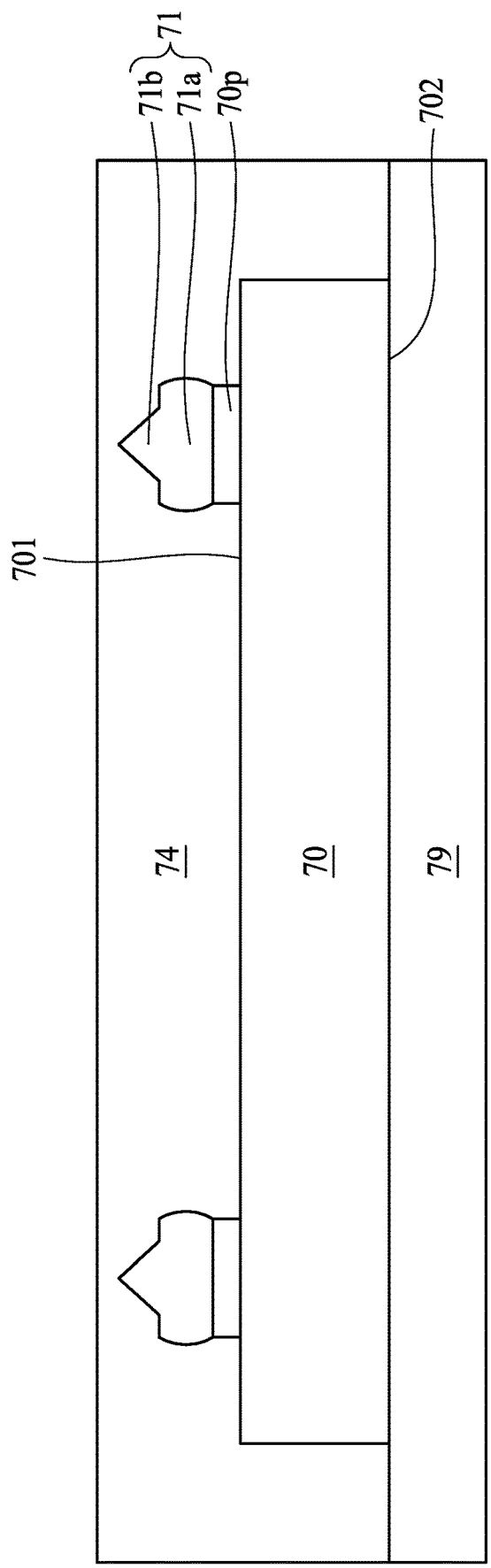
FIG. 7B illustrates one or more stages of a method of manufacturing a semiconductor package device in accordance with some embodiments of the present disclosure.

Referring to FIG. 7B, the back surface 702 of the electronic component 70 is attached to a carrier 79 through, for example, a glue or a tape. A package body 74 is then formed on the carrier to cover the electronic component 70 and the conductive bump 71. In some embodiments, the package body 74 includes, for example, organic materials (e.g., a molding compound, BT, a PI, a PBO, a solder resist, an ABF, a PP, an epoxy-based material, or a combination of two or more thereof), inorganic materials (e.g., silicon, a glass, a ceramic, a quartz, or combination of two or more thereof), liquid-film materials or dry-film materials, or a combination of two or more thereof. The package body 74 may be formed by a molding technique, such as transfer molding or compression molding.

Figure 7C:
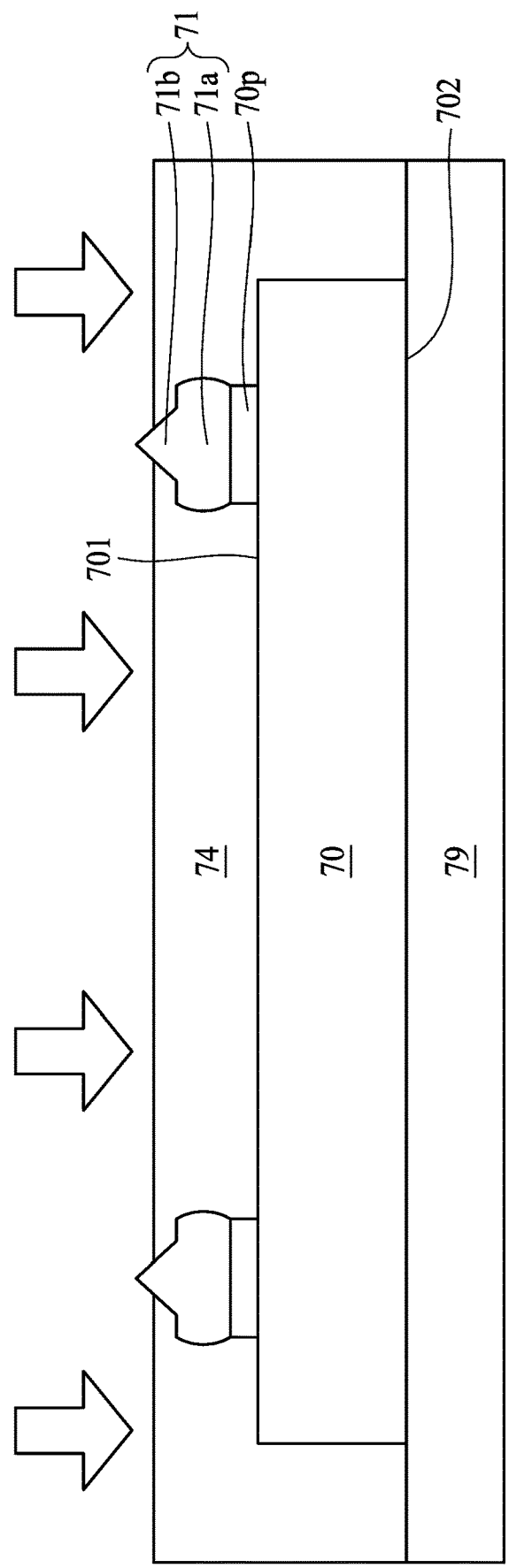
FIG. 7C illustrates one or more stages of a method of manufacturing a semiconductor package device in accordance with some embodiments of the present disclosure.

Referring to FIG. 7C, a portion of the package body 74 is removed to expose at least a portion of the protruding portion 71b of the conductive bump 71 (e.g., a peak or a tip of the protruding portion 71b of the conductive bump 71). In some embodiments, the package body 74 is removed by plasma etching or other suitable processes. In some embodiments, the plasma may include a mixture of tetrafluoromethane ($CF_4$) and oxygen ($O_2$). Compared with a grinding process, using plasma etching to remove the package body 74 can better prevent an interface between the conductive bump 71 and the package body 74 from cracking.

Figure 7D:
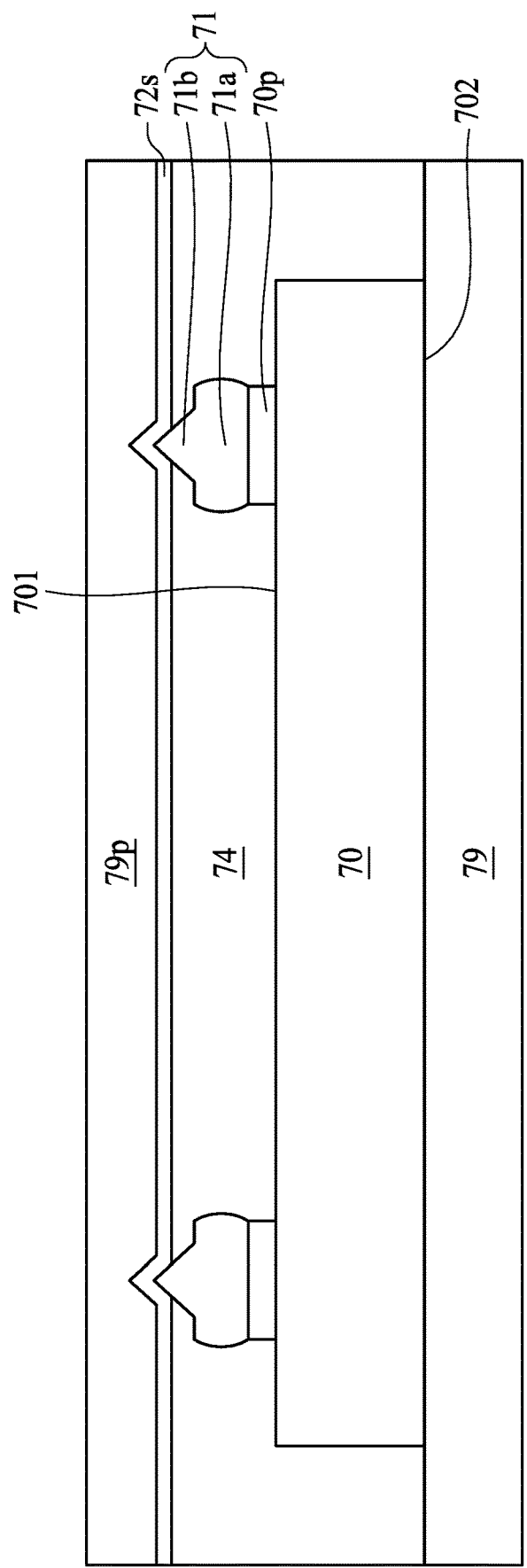
FIG. 7D illustrates one or more stages of a method of manufacturing a semiconductor package device in accordance with some embodiments of the present disclosure.

Referring to FIG. 7D, a seed layer 72s is formed on the package body 74 and the exposed portion of the protruding portion 71b of the conductive bump 71. In some embodiments, the seed layer 72s is formed by, for example, physical vapor deposition (PVD). A photoresist film 79p (or a mask) is formed on the seed layer 72s by, for example, coating.

Figure 7E:
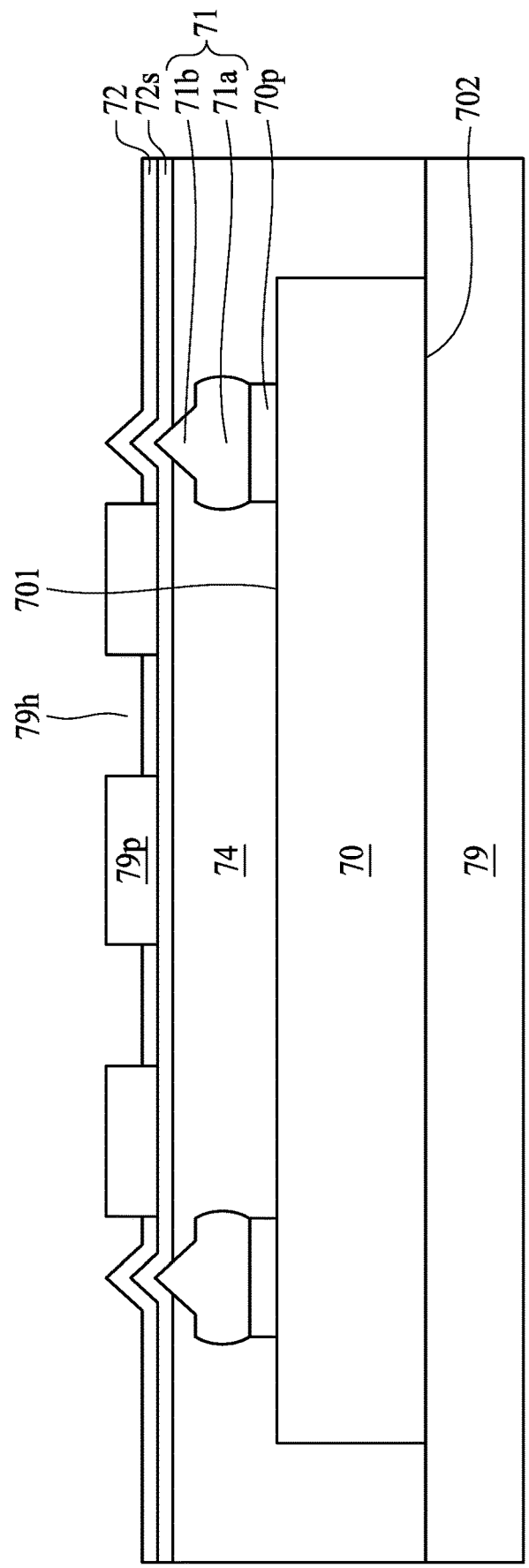
FIG. 7E illustrates one or more stages of a method of manufacturing a semiconductor package device in accordance with some embodiments of the present disclosure.

Referring to FIG. 7E, one or more openings 79h are formed in the photoresist film 79p by, for example, lithographic technique, to expose a portion of the seed layer 72s. A conductive layer 72 is formed on the exposed portion of the seed layer 72s. In some embodiments, the conductive layer 72 may be formed by sputtering titanium and copper (Ti/Cu) or a titanium-tungsten alloy (TiW) and then plating at least one of Cu, Ag, Au, or another metal. In some embodiments, the conductive layer 72 may be formed by electroless plating Ni or Cu and then plating Cu, Ag, Au, or another metal. In some embodiments, the conductive layer 72 may be formed by applying Cu, Ag, Au, or another metal and then printing Cu, Ag, Au, or another metal.

Figure 7F:
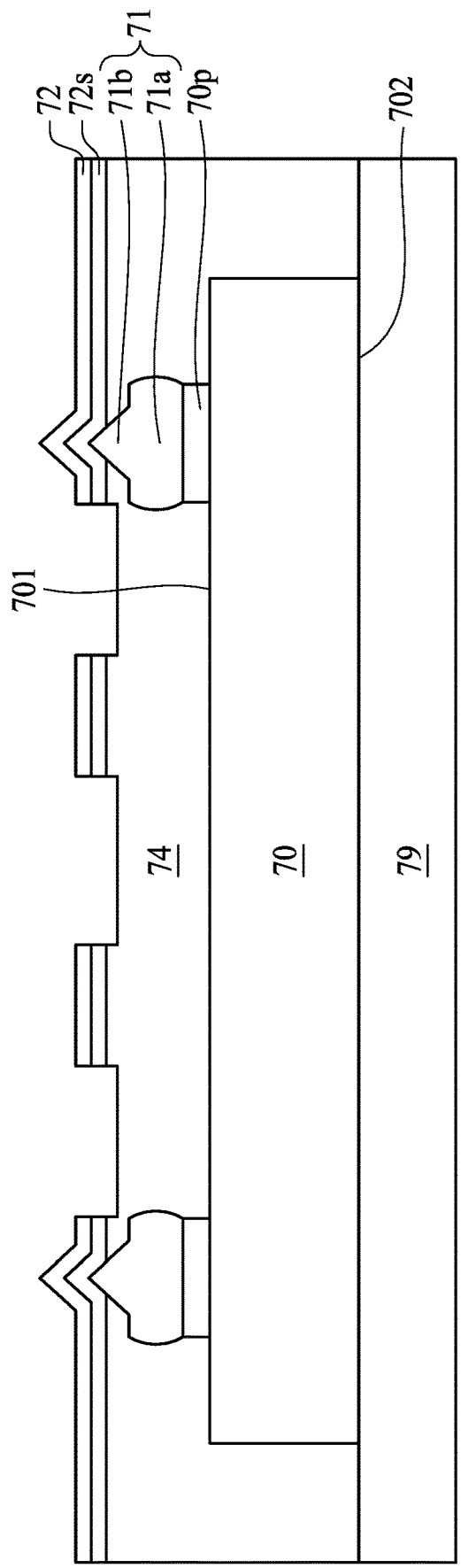
FIG. 7F illustrates one or more stages of a method of manufacturing a semiconductor package device in accordance with some embodiments of the present disclosure.

Referring to FIG. 7F, the photoresist film 79p is removed and a portion of the seed layer 72s that is not covered by the conductive layer 72 is removed. In some embodiments, the portion of the seed layer 72s is removed by etching or other suitable processes.

Figure 7G:
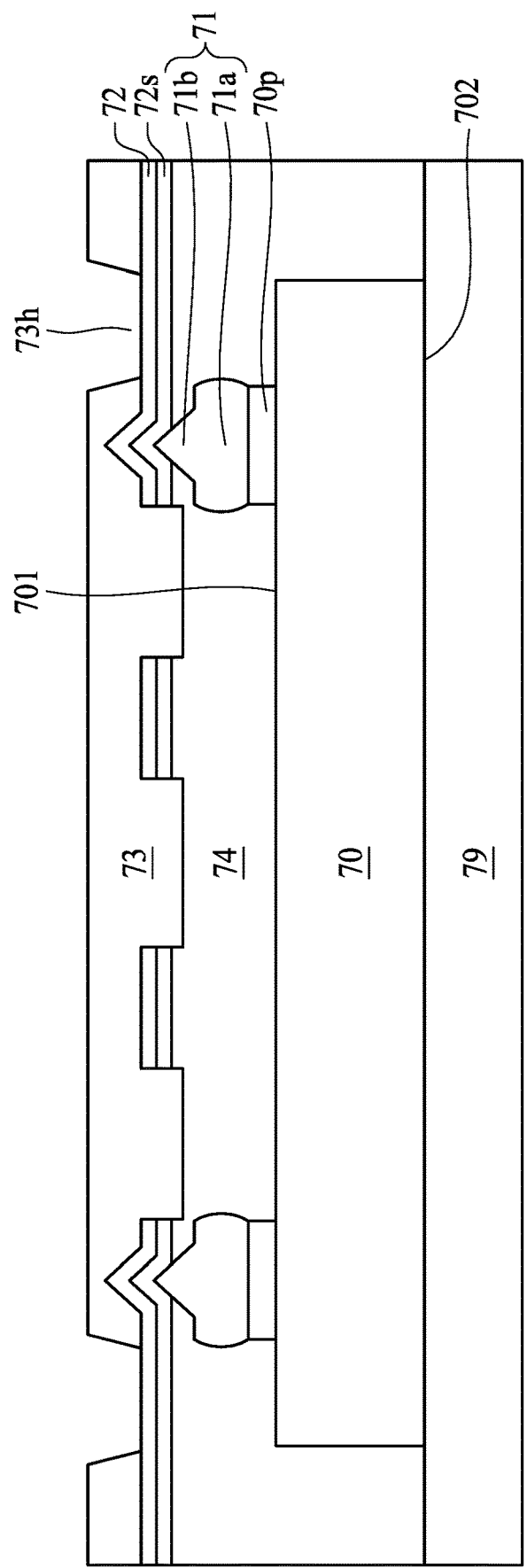
FIG. 7G illustrates one or more stages of a method of manufacturing a semiconductor package device in accordance with some embodiments of the present disclosure.

Referring to FIG. 7G, a passivation layer 73 (or a dielectric layer) is formed to cover the package body 74 and the conductive layer 72. In some embodiments, the passivation layer 73 is formed by, for example, coating. One or more openings 73h are formed in the passivation layer 73 by, for example, lithographic technique, to penetrate the passivation layer 73 and to expose a portion of the conductive layer 72. In some embodiments, the processes described above for formation of the passivation layer 73 may be repeatedly performed two or more times to form a multi-layer passivation layer.

Figure 7H:
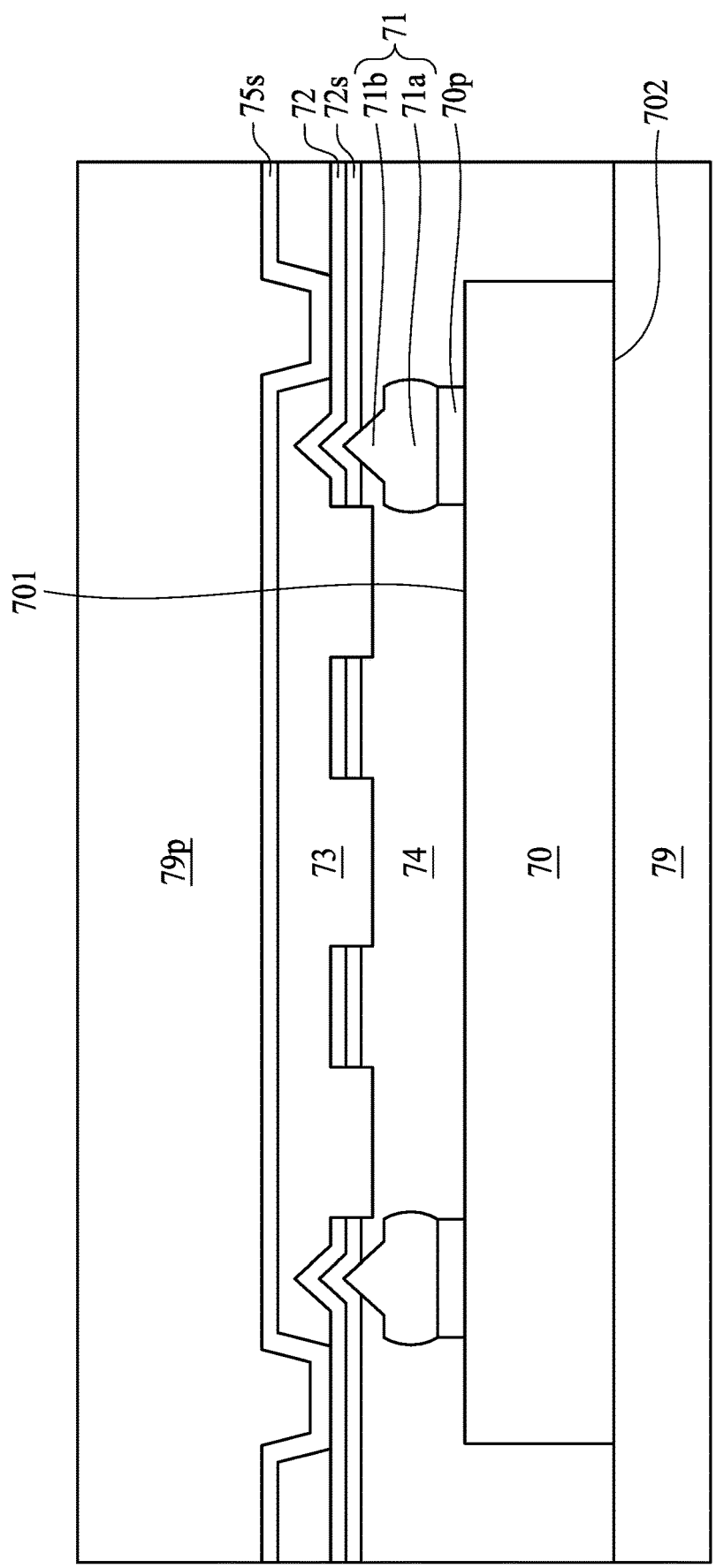
FIG. 7H illustrates one or more stages of a method of manufacturing a semiconductor package device in accordance with some embodiments of the present disclosure.

Referring to FIG. 7H, a seed layer 75s is formed on the passivation layer 73 and extending into the openings of the passivation layer 73 to be electrically connected to the exposed portion of the conductive layer 72. In some embodiments, the seed layer 75s is formed by, for example, PVD. A photoresist film 79p (or a mask) is formed on the seed layer 75s by, for example, coating.

Figure 7I:
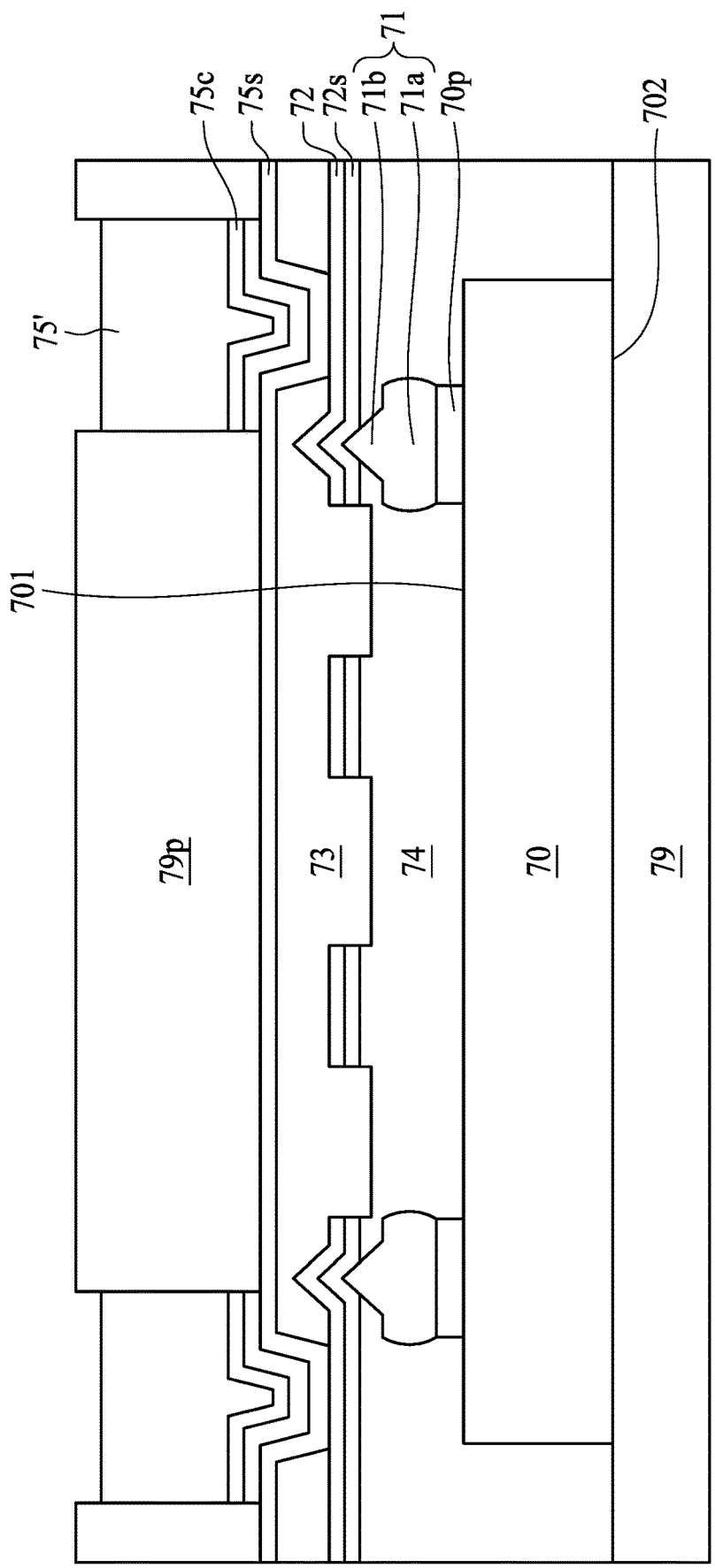
FIG. 7I illustrates one or more stages of a method of manufacturing a semiconductor package device in accordance with some embodiments of the present disclosure.

Referring to FIG. 7I, one or more openings are formed in the photoresist film 79p by, for example, lithographic technique, to penetrate the photoresist film 79p and to expose a portion of the seed layer 75s. A conductive layer 75c (e.g., a UBM layer) is formed within the openings of the photoresist film 79p to be electrically connected to the exposed portion of the seed layer 75s. In some embodiments, the conductive layer 75c may be formed by sputtering Ti/Cu or TiW and then plating at least one of Cu, Ag Au, or another metal. In some embodiments, the conductive layer 75c may be formed by electroless plating Ni or Cu and then plating Cu, Ag, Au, or another metal. In some embodiments, the conductive layer 75c may be formed by applying Cu, Ag, Au, or another metal and then printing Cu, Ag, Au, or another metal. A solder 75' is then formed within the openings and on the conductive layer 75c.

Figure 7J:
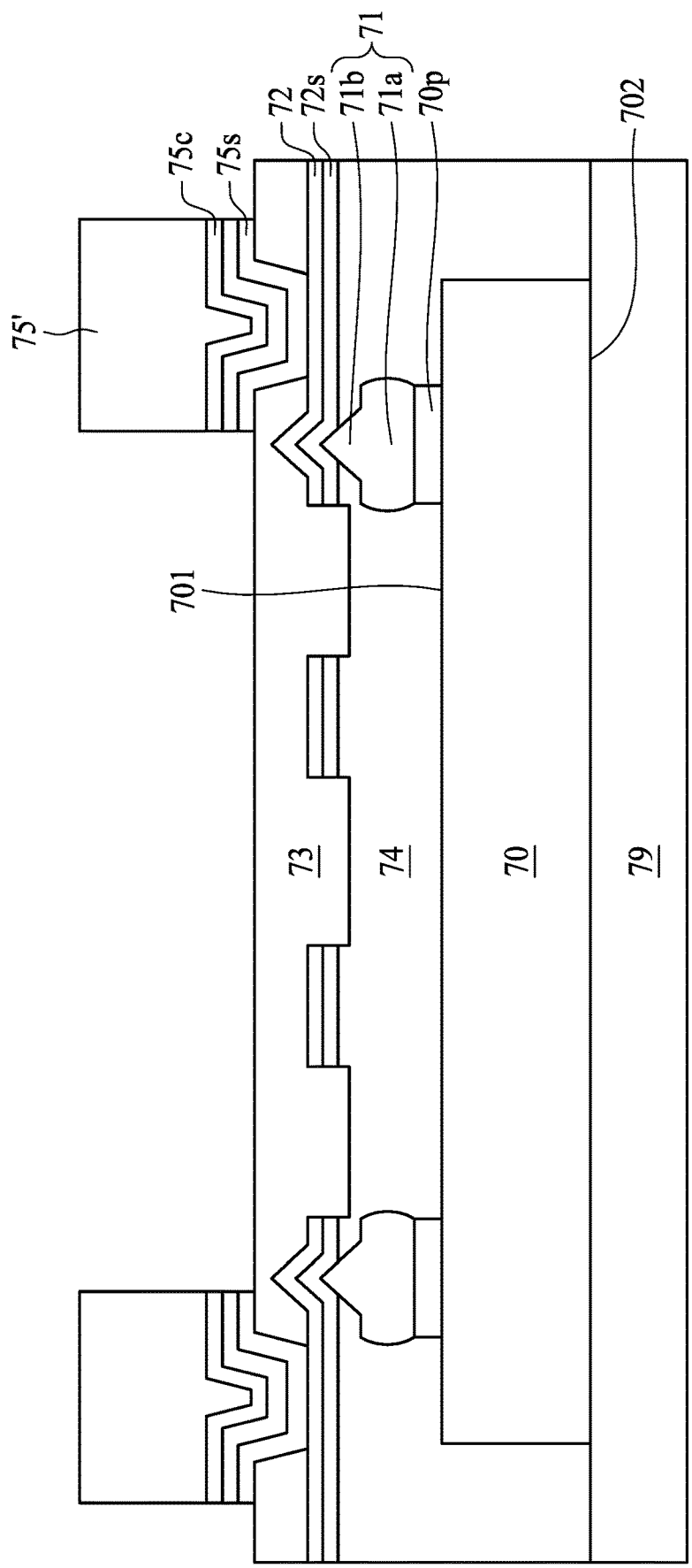
FIG. 7J illustrates one or more stages of a method of manufacturing a semiconductor package device in accordance with some embodiments of the present disclosure.

Referring to FIG. 7J, the photoresist film 79p is removed and a portion of the seed layer 75s that is not covered by the conductive layer 75c is removed. In some embodiments, the portion of the seed layer 75s is removed by etching or other suitable processes.

Figure 7K:
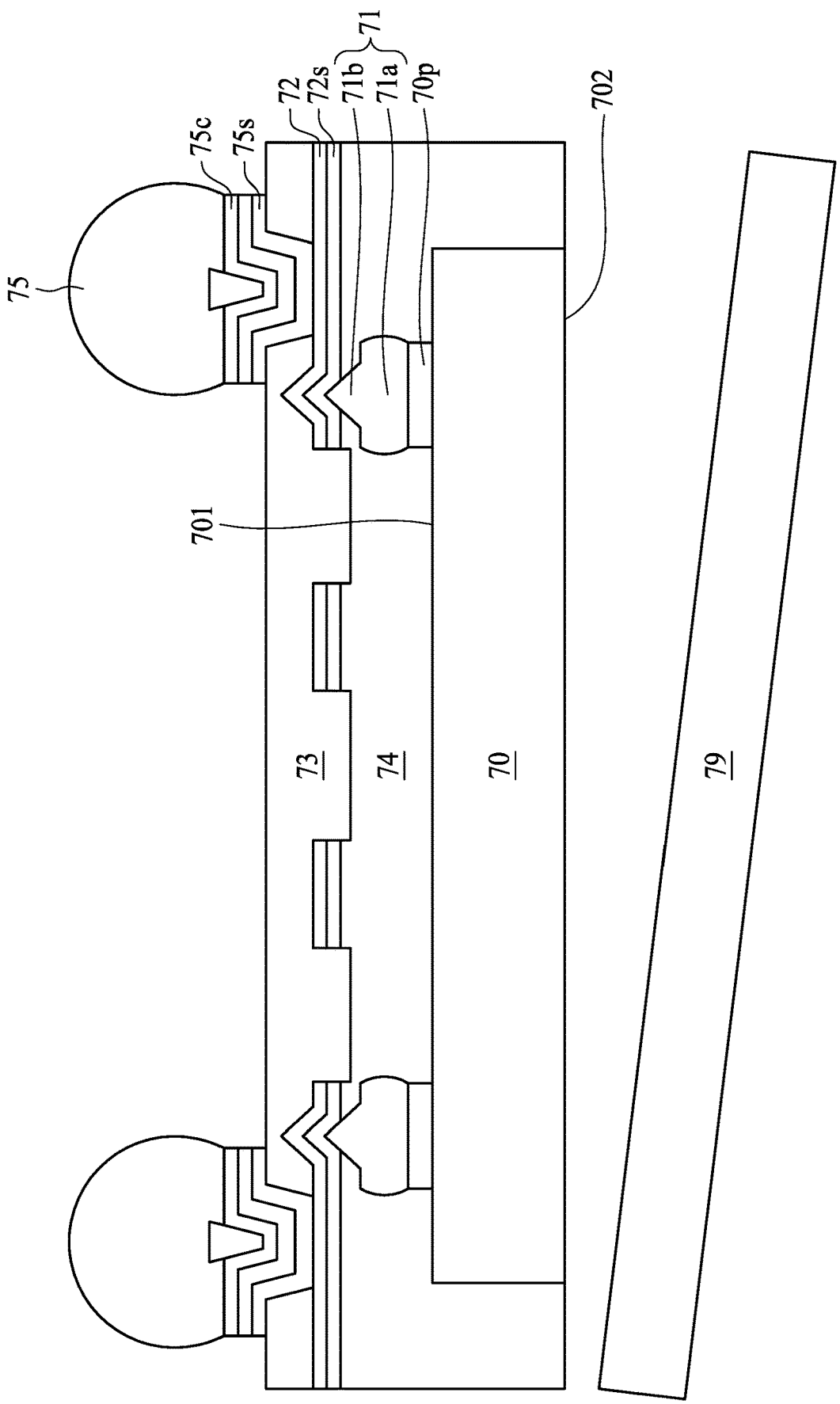
FIG. 7K illustrates one or more stages of a method of manufacturing a semiconductor package device in accordance with some embodiments of the present disclosure.

Referring to FIG. 7K, a reflow process is carried out to shape the solder 75' into a solder ball 75. Then, the carrier 79 is removed to expose the back surface 702 of the electronic component 70. In some embodiments, the structure shown in FIG. 7K is the same as the semiconductor package device 1 as shown in FIG. 1A.

Figure 8B:
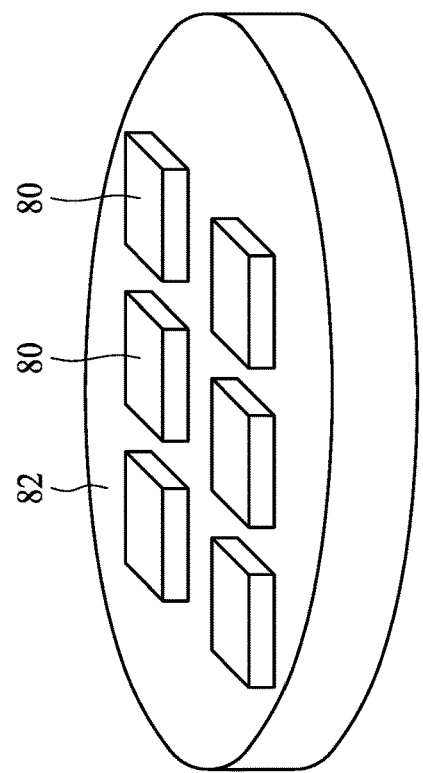
FIG. 8B illustrates examples of various types of semiconductor package devices in accordance with some embodiments of the present disclosure.
Figure 8A:
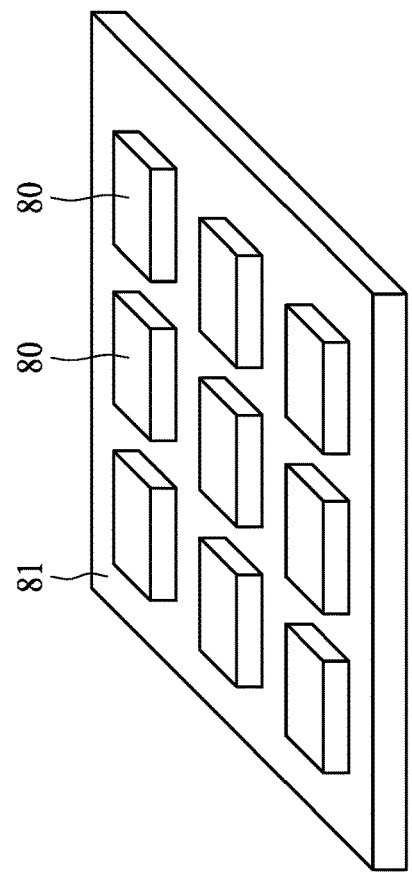
FIG. 8A illustrates examples of various types of semiconductor package devices in accordance with some embodiments of the present disclosure.

FIG. 8A and FIG. 8B illustrate examples of different types of semiconductor package devices in accordance with some embodiments of the present disclosure.

As shown in FIG. 8A, a plurality of chips 80 and/or dies are placed on a square-shaped carrier 81. In some embodiments, the carrier 81 may include organic materials (e.g., a molding compound, BT, a PI, a PBO, a solder resist, a ABF, a PP, an epoxy-based material, or a combination of two or more thereof) or inorganic materials (e.g., silicon, a glass, a ceramic, a quartz, or a combination of two or more thereof).

As shown in FIG. 8B, a plurality of chips 80 and/or dies are placed on a circle-shaped carrier 82. In some embodiments, the carrier 82 may include organic materials (e.g., a molding compound, BT, a PI, a PBO, a solder resist, an ABF, a PP, an epoxy-based material, or a combination of two or more thereof) or inorganic materials (e.g., silicon, a glass, a ceramic, a quartz, or a combination of two or more thereof).

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be planar or substantially planar if a displacement of the surface relative to a flat plane between any two points on the surface is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Spatial descriptions, such as "above," "below," "up," "left," "right," "down," "top," "bottom," "vertical," "horizontal," "side," "higher," "lower," "upper," "over," "under," "downward," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
   an electronic component having a top surface;
   a conductive bump disposed on the top surface of the electronic component, the conductive bump comprising a main body and a protruding portion; and
   a first conductive layer covering a portion of the protruding portion, the first conductive layer having a first upper surface and a second upper surface, wherein the first upper surface and the second upper surface are not coplanar,
   wherein the protruding portion of the conductive bump defines a peak covered by the first conductive layer.

2. The semiconductor package device of claim 1, wherein the first conductive layer further comprises a plurality of traces, and at least two traces of the plurality of traces extend over the conductive bump.

3. The semiconductor package device of claim 2, wherein at least one trace is disposed over the peak of the protruding portion of the conductive bump.

4. The semiconductor package device of claim 1, further comprising a first insulation layer covering the first conductive layer, wherein a top surface of the insulation layer is substantially parallel to the second upper surface of the first conductive layer.

5. The semiconductor package device of claim 4, further comprising a second conductive layer disposed on the first insulation layer.

6. The semiconductor package device of claim 1, further comprising a second insulation layer disposed between the first insulation layer and the first conductive layer, wherein at least a portion of a top surface of the second insulation layer is tilted relative to the top surface of the electronic component, defines a peak and has a first non-zero gradient relative to the top surface of the electronic component, and wherein the peak of the top surface of the second insulation layer is located over the protruding portion of the conductive bump.

7. The semiconductor package device of claim 5, further comprising a third insulation layer disposed between the second insulation layer and the first conductive layer, wherein at least a portion of a top surface of the third insulation layer is tilted relative to the top surface of the electronic component and has a second non-zero gradient relative to the top surface of the electronic component, and wherein the second gradient is greater than the first gradient.

8. The semiconductor package device of claim 1, wherein the first conductive layer is directly in contact with the conductive bump.

9. The semiconductor package device of claim 1, further comprising a package body encapsulating the electronic component and the conductive bump, wherein the portion of the protruding portion of the conductive bump is exposed from the package body.

10. The semiconductor package device of claim 1, further comprising:
 a sealing layer encapsulating a portion of the conductive bump and exposing the portion of the protruding portion of the conductive bump; and
 a package body encapsulating the electronic component and the sealing layer.

11. The semiconductor package device of claim 1, further comprising a seed layer disposed between the first conductive layer and the protruding portion of the conductive bump.

12. The semiconductor package device of claim 1, wherein the first conductive layer has:
 a third upper surface connecting to the first upper surface; and
 a fourth upper surface connecting to the third upper surface,
 wherein the third upper surface and the fourth upper surface are not coplanar.

13. The semiconductor package device of claim 12, wherein the second upper surface and the fourth upper surface are substantially parallel to the top surface of the electronic component.

14. The semiconductor package device of claim 1, wherein a distance between the first upper surface of the first conductive layer and the electronic component is greater than a distance between the second upper surface of the first conductive layer and the electronic component.

15. The semiconductor package device of claim 1, further comprising:
 a first insulation layer having a first top surface, the first top surface having a first gradient relative to the top surface of the electronic component; and
 a second insulation layer adjacent to the first conductive layer and having a second top surface, the second top surface having a second gradient relative to the top surface of the electronic component;
 wherein the first insulation layer is farther away from the first conductive layer than is the second insulation layer, and the first gradient is less than the second gradient.

16. The semiconductor package device of claim 1, wherein the first upper surface and the second upper surface define an external angle greater than 90 degrees and less than 180 degrees.

17. The semiconductor package device of claim 4, wherein the first insulation layer defines a cavity to expose a portion of the first conductive layer.

18. The semiconductor package device of claim 5, further comprising one or more electrical contacts disposed on the second conductive layer.

19. The semiconductor package device of claim 1, further comprising a seed layer, wherein the first conductive layer is disposed on the seed layer.

20. The semiconductor package device of claim 19, wherein the seed layer is disposed on the protruding portion of the conductive bump.

* * * * *